(12) United States Patent
Petschik (10) Patent No.: US 11,296,586 B2
(45) Date of Patent: Apr. 5, 2022

(54) GALVANOMETER DRIVE WITH MULTI-LAYER PERMANENT MAGNETS

(71) Applicant: Scanlab GmbH, Puchheim (DE)

(72) Inventor: Norbert Petschik, Puchheim (DE)

(73) Assignee: Scanlab GmbH, Puchheim (DE)

( * ) Notice: Subject to any disclaimer, the term of this patent is extended or adjusted under 35 U.S.C. 154(b) by 232 days.

(21) Appl. No.: 16/472,879

(22) PCT Filed: Dec. 5, 2017

(86) PCT No.: PCT/EP2017/081537
§ 371 (c)(1),
(2) Date: Jun. 23, 2019

(87) PCT Pub. No.: WO2018/114326
PCT Pub. Date: Jun. 28, 2018

(65) Prior Publication Data
US 2019/0341834 A1    Nov. 7, 2019

(30) Foreign Application Priority Data

Dec. 23, 2016  (DE) ............... 10 2016 125 558.0

(51) Int. Cl.
| | |
|---|---|
| *H02K 1/27* | (2006.01) |
| *H02K 26/00* | (2006.01) |
| *G02B 26/10* | (2006.01) |
| *H02K 1/2733* | (2022.01) |

(52) U.S. Cl.
CPC ........... *H02K 26/00* (2013.01); *G02B 26/105* (2013.01); *H02K 1/2733* (2013.01)

(58) Field of Classification Search
CPC ............... H02K 26/00; H02K 1/2733; H02K 1/27–1/2793; H02K 1/278; G02B 26/105; G01R 5/06
See application file for complete search history.

(56) References Cited

U.S. PATENT DOCUMENTS

| | | | |
|---|---|---|---|
| 6,809,451 B1 | 10/2004 | Brown | |
| 2004/0046469 A1 | 3/2004 | Oshima et al. | |
| 2006/0097595 A1* | 5/2006 | Randriamanantena | .. H02K 1/30 310/156.08 |

(Continued)

FOREIGN PATENT DOCUMENTS

| | | |
|---|---|---|
| CH | 693014 A5 | 1/2003 |
| DE | 10 2007 037183 A1 | 2/2008 |

(Continued)

OTHER PUBLICATIONS

German Patent Office Search Report, dated Aug. 23, 2017.

(Continued)

*Primary Examiner* — Thomas Truong
(74) *Attorney, Agent, or Firm* — Dority & Manning, P.A.

(57) ABSTRACT

A galvanometer drive particularly useful for a deflection unit includes a rotor that is rotatable about a rotational axis, the rotor formed in at least one section by a permanent magnet. A stator surrounds the permanent magnet, the stator including a coil. The permanent magnet includes at least two magnetic layers and at least one electrically insulating intermediate layer arranged between the two magnetic layers. A method for manufacturing the rotor for the galvanometer is also provided.

12 Claims, 8 Drawing Sheets

(56) References Cited

U.S. PATENT DOCUMENTS

| | | | | |
|---|---|---|---|---|
| 2007/0007828 A1* | 1/2007 | Doi | .................... | H02K 1/2733 |
| | | | | 310/36 |
| 2011/0304234 A1* | 12/2011 | Ramon | ................ | H02K 5/1672 |
| | | | | 310/156.21 |
| 2012/0229239 A1* | 9/2012 | Urda | .................. | C22C 33/0257 |
| | | | | 335/302 |
| 2014/0015364 A1* | 1/2014 | Iwatsu | .................... | H02K 1/02 |
| | | | | 310/156.53 |
| 2014/0285036 A1* | 9/2014 | Yamamoto | ............. | H02K 33/00 |
| | | | | 310/38 |

FOREIGN PATENT DOCUMENTS

| | | |
|---|---|---|
| EP | 2 306 620 A2 | 4/2011 |
| EP | 2 713 481 A2 | 4/2014 |
| JP | 2010 220440 A | 9/2010 |

OTHER PUBLICATIONS

PCT Search Report, dated Mar. 29, 2018.
PCT IPRP, Jul. 4, 2019.
Wikipedia Article—Galvanometer—with English version; https://en.wikipedia.org/wiki/Galvanometer—Oct. 27, 2019.
Chinese Office Action, dated Sep. 16, 2021.

\* cited by examiner

GALVANOMETER DRIVE WITH MULTI-LAYER PERMANENT MAGNETS

FIELD OF THE INVENTION

The present invention relates to a galvanometer drive comprising a rotor which is rotatable about a rotational axis and is formed, at least in one section, by a permanent magnet. In addition, the galvanometer drive comprises a stator which surrounds the permanent magnet and includes a coil. Moreover, the present invention relates to a manufacturing method for a rotor of a galvanometer drive, which is designed as a permanent magnet. Moreover, the invention relates to a deflection unit for deflecting a laser beam, comprising an optical deflection element, in particular a mirror, and comprising a galvanometer drive connected to the optical deflection element, with the aid of which the deflection element is bidirectionally rotatable through a limited rotation range.

BACKGROUND

Galvanometer drives are utilized, in particular, during the execution of laser applications, such as laser marking, generative production, laser welding, or laser cutting, in order to position optical elements, such as mirrors, for deflecting a processing laser beam. This involves rotary motors, which have a limited angular range and essentially include a coil and a moving permanent magnet in the embodiment as a "moving magnet" galvanometer drive, which is common nowadays. During an operation of the galvanometer drive, the permanent magnet of the galvanometer drive rotates in an external magnetic field which is generated with the aid of a stator comprising the coil. Since the high-power magnets available nowadays are made of metals or metal alloys, for example, neodymium iron boron or samarium cobalt, the permanent magnet has electrical conductivity. If the strength of the magnetic field changes or if the permanent magnet rotates in the magnetic field generated by the stator, a voltage is induced in the permanent magnet, which results in an eddy current in the electrically conductive magnetic material. In particular in the case of modern digital control processes which are based on pulse-width modulation, the polarity of the current through the coil is permanently reversed with frequencies in the kHz-MHz range, whereby the resultant magnetic field also oscillates at such high frequencies and a correspondingly great eddy current can result. Such an eddy current is converted into heat due to ohmic losses. Due to the heating, the magnetization of the permanent magnet can decrease, on the one hand, whereby the performance of the galvanometer drive is worsened and, consequently, the driven deflection means can no longer rotate as quickly. In addition, the heating results in an expansion of the permanent magnet, and so stresses and deformations occur, whereby, in turn, the deflection accuracy is negatively affected.

DE 10 2007 037 183 A1 describes a pivoting actuator for a laser processing device, which encompasses a permanent magnet including radial grooves, with the aid of which eddy currents are interrupted, in order to suppress the temperature increase. The disadvantage thereof, however, is that the radial grooves can be formed in the permanent magnet only with difficulty and they only insufficiently suppress the eddy current.

A problem addressed by the present invention is therefore that of creating a galvanometer drive, with the aid of which the eddy current in the permanent magnet can be more effectively suppressed and/or which can be cost-effectively manufactured.

SUMMARY OF THE INVENTION

Additional objects and advantages of the invention will be set forth in part in the following description, or may be obvious from the description, or may be learned through practice of the invention.

The problem is solved by a galvanometer drive, a manufacturing method for a rotor of a galvanometer drive, which is designed as a permanent magnet, and a deflection unit for deflecting a laser beam, having the features described herein.

The invention relates to a galvanometer drive comprising a rotor that is rotatable about a rotational axis and is formed, at least in one section, as a permanent magnet. The permanent magnet therefore forms at least one longitudinal section of a shaft of the galvanometer drive. As a result, the galvanometer drive can be easily and, therefore, cost-effectively manufactured. Moreover, the galvanometer drive comprises a stator that surrounds the permanent magnet and includes a coil. A magnetic field can be generated with the aid of the coil, which interacts with the magnetic field of the permanent magnet, and so the permanent magnet is set into rotation. The permanent magnet comprises at least two magnetic layers. In addition, the permanent magnet comprises at least one electrically insulating intermediate layer arranged between the magnetic layers. This prevents the eddy current from extending from one of the two magnetic layers to the particular adjacent magnetic layer. The eddy current is therefore inhibited in terms of its formation, and so the heating of the permanent magnet is reduced. The performance of the galvanometer drive can be improved as a result.

It is advantageous when the permanent magnet is formed from two magnetic layers, wherein one or more intermediate layers can be arranged between the two magnetic layers. The permanent magnet can also be formed from multiple magnetic layers, however. One or more intermediate layers are then arranged between two adjacent magnetic layers in each case, in order to electrically insulate the particular magnetic layers from one another.

It is advantageous when a ratio of the electrical conductivity of the magnetic layer with respect to the intermediate layer is at least $10^6$, preferably at least $10^{12}$, particularly preferably at least $10^{22}$.

In an advantageous enhanced embodiment of the invention, the at least one intermediate layer connects the two magnetic layers in an integrally joined manner. As a result, the intermediate layer acts as a connecting element for the two mutually adjacent magnetic layers, and so an additional connecting element can be dispensed with. As a result, the galvanometer drive can be cost-effectively manufactured.

Moreover, it is advantageous when the magnetic layers have a thickness of less than or equal to 2 mm. The thinner the magnetic layers are, the smaller the eddy current is, which forms in the magnetic layers. Consequently, a heating of the permanent magnet can also be reduced.

Additionally or alternatively, the magnetic layers can also have an identical thickness with respect to one another. The permanent magnet can be more simply formed with the aid of magnetic layers having the same thickness. Magnetic layers having different thicknesses can be utilized, for example, when the permanent magnet is exposed to an inhomogeneous magnetic field. For example, thinner magnetic layers can be arranged where a stronger magnetic field is formed, since the eddy current is stronger at these points. Thicker magnetic layers can be arranged at points at which the magnetic field is weaker, however, since the eddy current is weaker here.

It is also advantageous when the thickness of the intermediate layer corresponds at most to 10% of the thickness of at least one of the adjacent magnetic layers. The thickness of the intermediate layer can also correspond to only 5% of the thickness of at least one of the adjacent magnetic layers, however. The thickness of the intermediate layer can also correspond to only 1% of the thickness of at least one of the adjacent magnetic layers. The aforementioned values for the thickness of the intermediate layer can also relate, for example, to the thinnest magnetic layer. The intermediate layer must electrically insulate the two adjacent magnetic layers from one another on the one hand. On the other hand, the intermediate layer must also not be too thick, since the permanent magnet otherwise does not have sufficient magnetization.

It is likewise advantageous when the magnetic layers and the intermediate layers extend completely through the rotor in the longitudinal direction or in the transverse direction of the rotor. It is particularly advantageous when every single one of the magnetic layers and the intermediate layers extends completely through the rotor in the longitudinal direction or in the transverse direction of the rotor. As a result, the suppression of the eddy current is at a maximum, and so the performance of the galvanometer drive is increased.

It is additionally advantageous when the permanent magnet is formed in a sandwich-like manner from a plurality of magnetic layers and/or intermediate layers arranged one above the other. The magnetic layers and the intermediate layers can be arranged in an alternating manner. As a result, two magnetic layers are separated by at least one intermediate layer in each case, and so the eddy current in the permanent magnet can extend only onto the individual magnetic layers. The eddy current is kept low as a result.

In an advantageous enhanced embodiment of the invention, the magnetic layers and/or the intermediate layers are stacked one above the other along a layer axis. Additionally or alternatively, the layer axis extends in parallel to the rotational axis, and so the magnetic layers and/or the intermediate layers are aligned perpendicularly to the rotational axis. As a result, the strength of the eddy current, which extends in parallel to the rotational axis, is reduced.

It is also advantageous when the layer axis extends transversely to the rotational axis. The layer axis can be preferably arranged perpendicularly to the rotational axis. Additionally or alternatively, the magnetic layers and/or the intermediate layers can be aligned in parallel to the rotational axis. As a result, eddy currents, which are arranged in a plane perpendicular to the rotational axis, can be prevented.

Moreover, it is advantageous when the permanent magnet has a direction of magnetization which is perpendicular to the rotational axis. The magnetic field formed by the permanent magnet is therefore oriented perpendicularly to the rotational axis. The external magnetic field generated by the stator can be likewise oriented perpendicularly to the rotational axis of the rotor. As a result, the galvanometer drive can apply a high torque to the permanent magnet.

Moreover, it is advantageous when the layer axis is aligned with an angular deviation of less than ±30° with respect to the direction of magnetization. The angular deviation can also be less than ±15°, however. In this case, an effective interruption of the eddy current can take place.

Moreover, it is advantageous when the at least one intermediate layer is formed from a coating means, since the permanent magnet can be manufactured highly cost-effectively as a result. The intermediate layer can be formed, for example, from a corrosion-resistant and/or liquid, powdery, or gaseous coating means. In addition, the coating means can be, for example, a varnish. The gaseous coating means can be applied onto the magnetic layers, for example, with the aid of a method for vapor deposition. As a result, particularly thin intermediate layers can be formed, which act as electrical insulation between the magnetic layers. The coating means can also encompass, for example, a plastic layer.

Additionally or alternatively, the outer surface of the permanent magnet is coated with the coating means. The coating means can be corrosion-resistant, and so it protects the permanent magnet against corrosion.

It is also advantageous when the magnetic layers, with respect to the layer axis, are designed to be thinner in an inner area located between two edge areas of the permanent magnet than in at least one of the two edge areas. The magnetic field can be weaker in at least one edge area of the permanent magnet than in the inner area, for example, when the permanent magnet is longer than the stator, and so the permanent magnet protrudes, via the edge areas, from the stator. As a result, the strength of the eddy currents decreases in the edge areas, and so thicker magnetic layers suffice here. The magnetic field is stronger in the inner area, however, and so thinner magnetic layers are better suited here for inhibiting the eddy current. Moreover, the permanent magnet becomes more stable as a result, since the thicker layers arranged in the edge area cannot detach as easily.

Moreover, it is advantageous when the permanent magnet is designed as a solid body. Additionally or alternatively, the permanent magnet has a rotationally symmetrical, in particular cylindrical, basic shape. The outer diameter of the permanent magnet can be between 2 mm and 20 mm. The solid body preferably includes no cavities, bore holes, or the like, and so the permanent magnet is formed completely from the magnetic layers and the intermediate layers.

In an advantageous enhanced embodiment of the invention, the galvanometer drive comprises two support projections, which are coaxial with the rotational axis and are connected to the permanent magnet, one on each end face of the permanent magnet. The connection can be designed to be, for example, integrally joined. Alternatively, the solid body can also encompass a through-hole which is coaxial with the rotational axis and in which a support shaft is arranged, which projects over the permanent magnet on the end face.

It is advantageous when the rotor is rotatably mounted in the support projections or in the protruding sections of the support shaft. The rotor can therefore be rotated bidirectionally through a limited rotation range. Moreover, a deflection unit, in particular a mirror, and/or a sensor for sensing the rotation angle of the rotor can be arranged on one of the two support projections, one on each end.

Moreover, the invention relates to a manufacturing method for a rotor of a galvanometer drive, which is designed as a permanent magnet. The galvanometer drive can be designed and/or manufactured according to one or more of the features mentioned in the preceding description and/or in the following description, wherein the mentioned features can be present individually or in any combination. In this manufacturing method, multiple magnetic layers are connected to one another in an integrally joined manner to form a blank. Additionally or alternatively, the outer contour of the blank is subsequently reworked, in particular mechanically, in order to form the rotor. As a result, the rotor can be manufactured particularly easily and, therefore, cost-effectively.

It is advantageous when the blank is reworked via turning and/or milling and/or grinding.

Moreover, the invention relates to a deflection unit for deflecting a laser beam, comprising an optical deflection element and a galvanometer drive connected to the optical deflection element, with the aid of which the deflection element is bidirectionally rotatable through a limited rotation range. The deflection element can be, for example, a mirror. The deflection element is therefore rotated with the aid of the galvanometer drive, whereby the laser beam can be guided over a processing surface of a workpiece. The galvanometer drive is designed according to the preceding description, wherein the mentioned features can be present individually or in any combination.

BRIEF DESCRIPTION OF THE DRAWINGS

Further advantages of the invention are described in the following exemplary embodiments. Wherein.

DETAILED DESCRIPTION

Reference will now be made to embodiments of the invention, one or more examples of which are shown in the drawings. Each embodiment is provided by way of explanation of the invention, and not as a limitation of the invention. For example features illustrated or described as part of one embodiment can be combined with another embodiment to yield still another embodiment. It is intended that the present invention include these and other modifications and variations to the embodiments described herein.

Figure 1A:
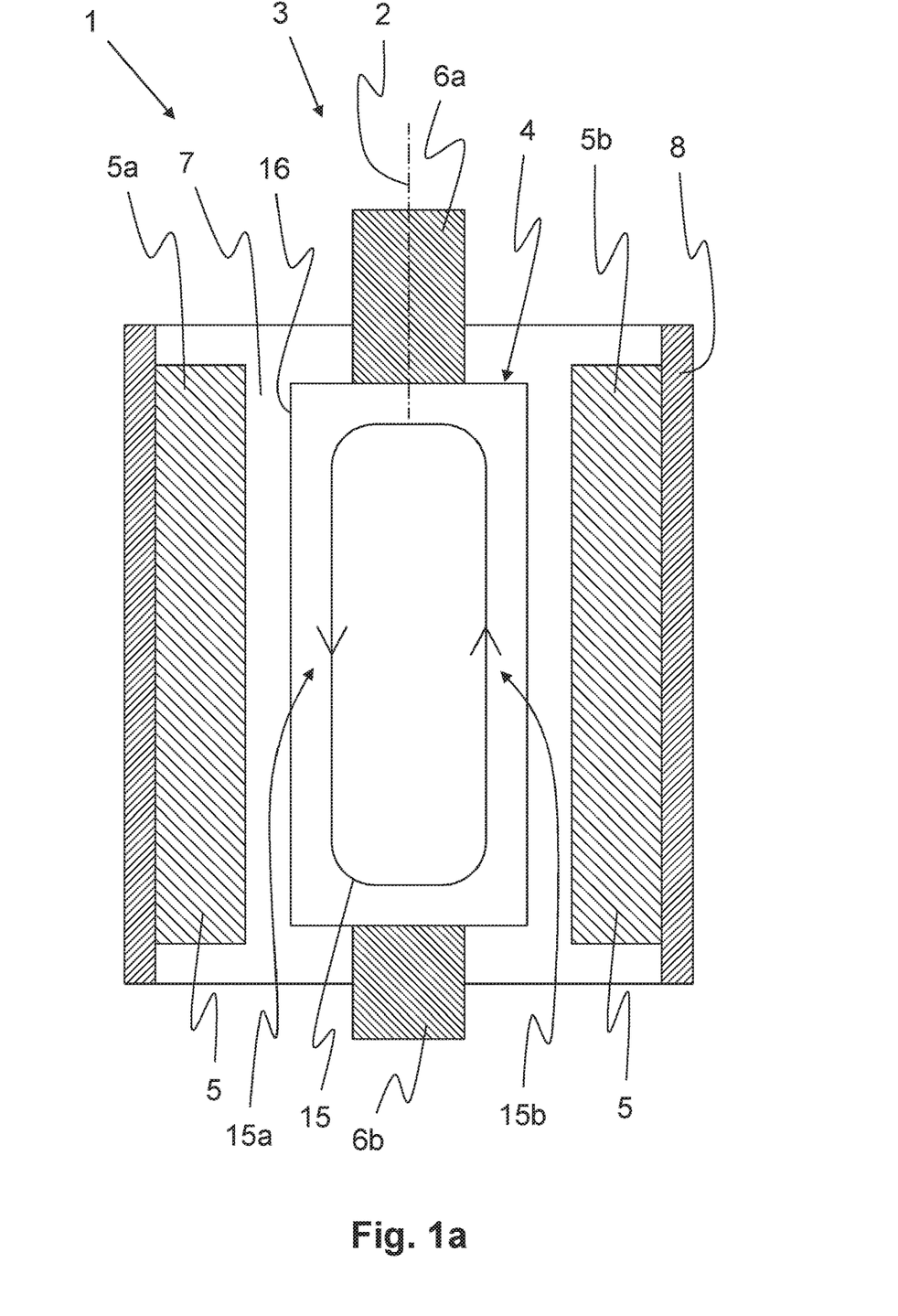
FIG. 1a shows a longitudinal section of a galvanometer drive comprising a rotatable permanent magnet.

FIG. 1a shows a galvanometer drive 1 comprising a rotor 3 that is rotatable about a rotational axis 2. At least one section of the rotor 3 is designed as a permanent magnet 4. For the sake of clarity, the permanent magnet 4 is not shaded in the illustration. In the present case, this section is located in the area of a stator 5. The permanent magnet 4 therefore forms a least one part or one section of a shaft of the galvanometer drive 1. As mentioned above, the galvanometer drive 1 further comprises a stator 5 which surrounds the permanent magnet 4 and includes a coil which is not represented in further detail. The stator 5 is formed from the two stator components 5a and 5b, wherein the stator 5 can also be formed as one piece or from multiple stator components, of course. Moreover, windings of a coil can be located in both stator components 5a and 5b, although one coil can also be arranged in each stator component 5a and 5b, however.

A support projection 6a, 6b is arranged on each of the two end faces of the permanent magnet 4. The support projections 6a, 6b are connected to the permanent magnet 4 and, therefore, rotate along with the permanent magnet 4. The two support projections 6a, 6b are therefore likewise an integral part of the rotor 3. The support projections 6a, 6b are also rotatably accommodated in bearings which are not shown here. Moreover, a gap 7 is formed between the permanent magnet 4 and the stator 5, and so the permanent magnet 4 can rotate contactlessly within the stator 5. The stator 5 and the rotor 3 are also arranged in a housing 8 of the galvanometer drive 1. The permanent magnet 4 comprises an outer surface 16 which faces the stator 5.

In order to induce a rotation of the rotor 3 with respect to the stator 5, a voltage is applied to the coil or coils arranged in the stator 5, and so a current flows. Due to the interaction of the magnetic field of the permanent magnet 4 with the current-carrying conductor of the coil, a torque is induced, which sets the rotor 3 into rotation. The angular acceleration of the rotor 3 is essentially proportional to the current flow through the coil. In particular, the direction of the rotary motion of the rotor 3 can also be reversed by reversing the polarity of the current direction. With the aid of a constant regulation of the amperage and direction of the current, it can be ensured that the rotary motion of the rotor 3 follows a predefined trajectory.

Moreover, the permanent magnet 4 is formed from an electrically conductive material. An eddy current 15 is induced in the permanent magnet 4 due to the constant change of the current flow and, therefore, of the magnetic field of the coil of the stator 5, which is necessary in order to follow the desired trajectories in a highly dynamic manner or which result from the pulse-width modulation. In the present exemplary embodiment, the eddy current 15 is formed oriented in the counterclockwise direction. Moreover, the eddy current 15 includes an eddy current component 15a which faces the stator 5a, and an eddy current component 15b which faces the stator 5b. Due to dissipation in the permanent magnet 4, at least a portion of the eddy current 15 is converted into heat, and so the permanent magnet 4 heats up. The heating is disadvantageous, however, since the magnetization of the permanent magnet 4 can weaken, whereby the torque acting on the permanent magnet 4 is reduced, and so the rotor 3 can no longer be rotated sufficiently quickly and precisely. In addition, the heating results in an expansion of the permanent magnet 4 and/or of the rotor 3, and so a controlled rotation of the rotor 3 is no longer given.

With the aid of the rotor 3, for example, a deflection element (not shown here), for example, a mirror, of a laser processing device can be rotated. For this purpose, high requirements are placed on the dynamics and the accuracy of the rotary motion, of course. Therefore, the negative effects of the eddy current 15 are to be reduced. The formation of the eddy current 15 will be described in greater detail in the following with reference to FIG. 1b.

Figure 1B:
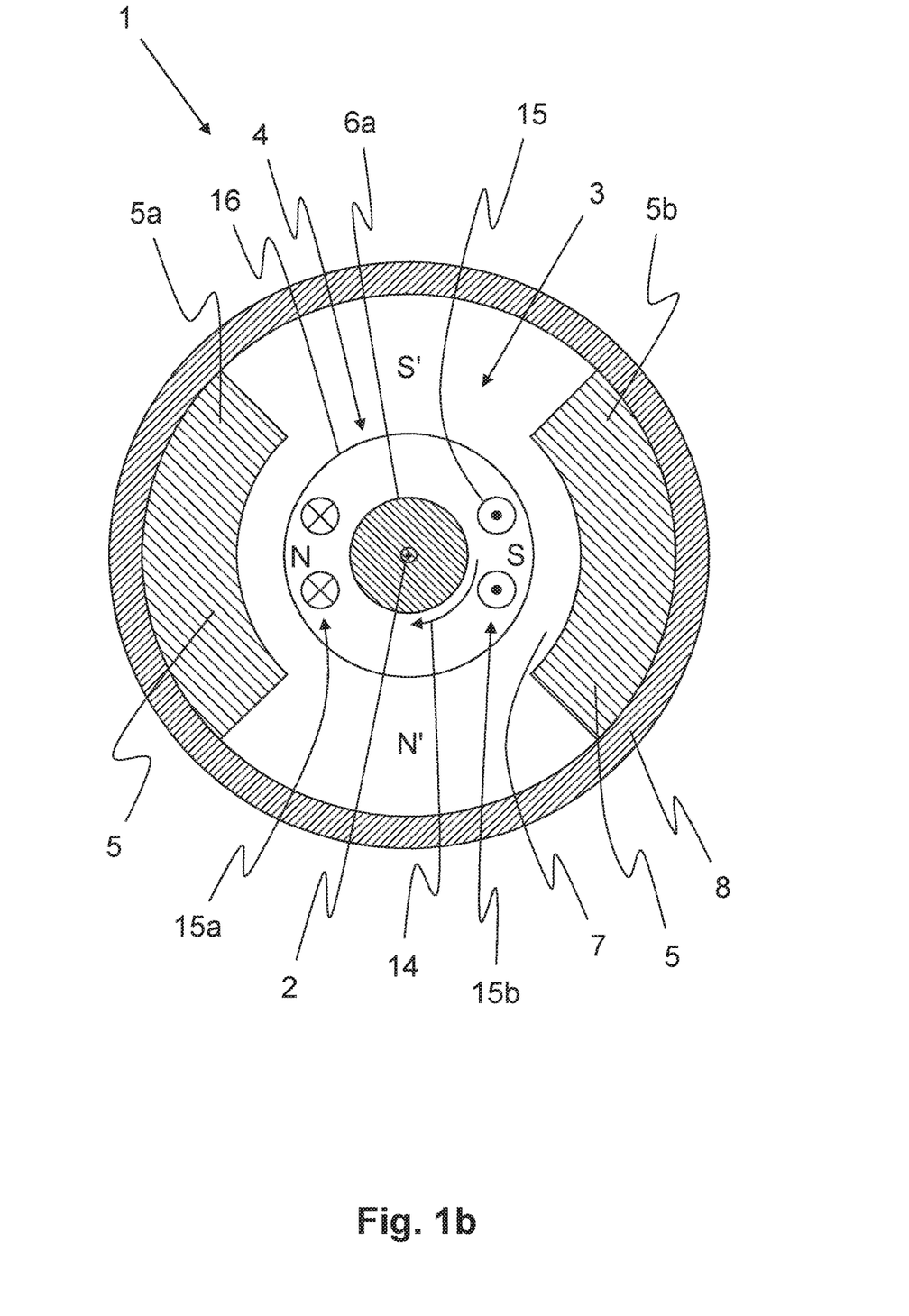
FIG. 1b shows a cross-section of the galvanometer drive including an eddy current formed in the permanent magnet.

FIG. 1b shows a cross-sectional view of the galvanometer drive 1. For the sake of clarity, the permanent magnet 4 is not shaded in the illustration. An eddy current 15 (cf. FIG. 1a) is formed in the permanent magnet 4, which, in the represented section, comprises an eddy current component 15a which is directed away from the observer, as shown in the figure, on the side of the permanent magnet 4 facing the stator component 5a. In addition, the eddy current 15 comprises an eddy current component 15b which extends toward the observer, as shown in the figure, on the side of the permanent magnet 4 facing the stator component 5b.

A substantial cause of the eddy current 15 comprising the two eddy current components 15a, 15b is the induction of a voltage in the permanent magnet 4 due to a rapid change of the external magnetic field of the stator 5. The stator 5 generates a magnetic field which, in the present exemplary embodiment, comprises a south pole S' and a north pole N' and extends substantially perpendicularly to the magnetic field of the permanent magnet 4 (in the plane of the drawing, the magnetic field of the stator 5 is therefore vertically oriented in the area of the permanent magnet 4). The induced curl field extends perpendicularly to the direction of the magnetic field of the stator 5 and forms the eddy current 15 (FIGS. 1a/1b). Moreover, the magnetic field of the permanent magnet 4 comprises a north pole N which faces the stator component 5a, and a south pole S which faces the stator component 5b.

Figure 2A:
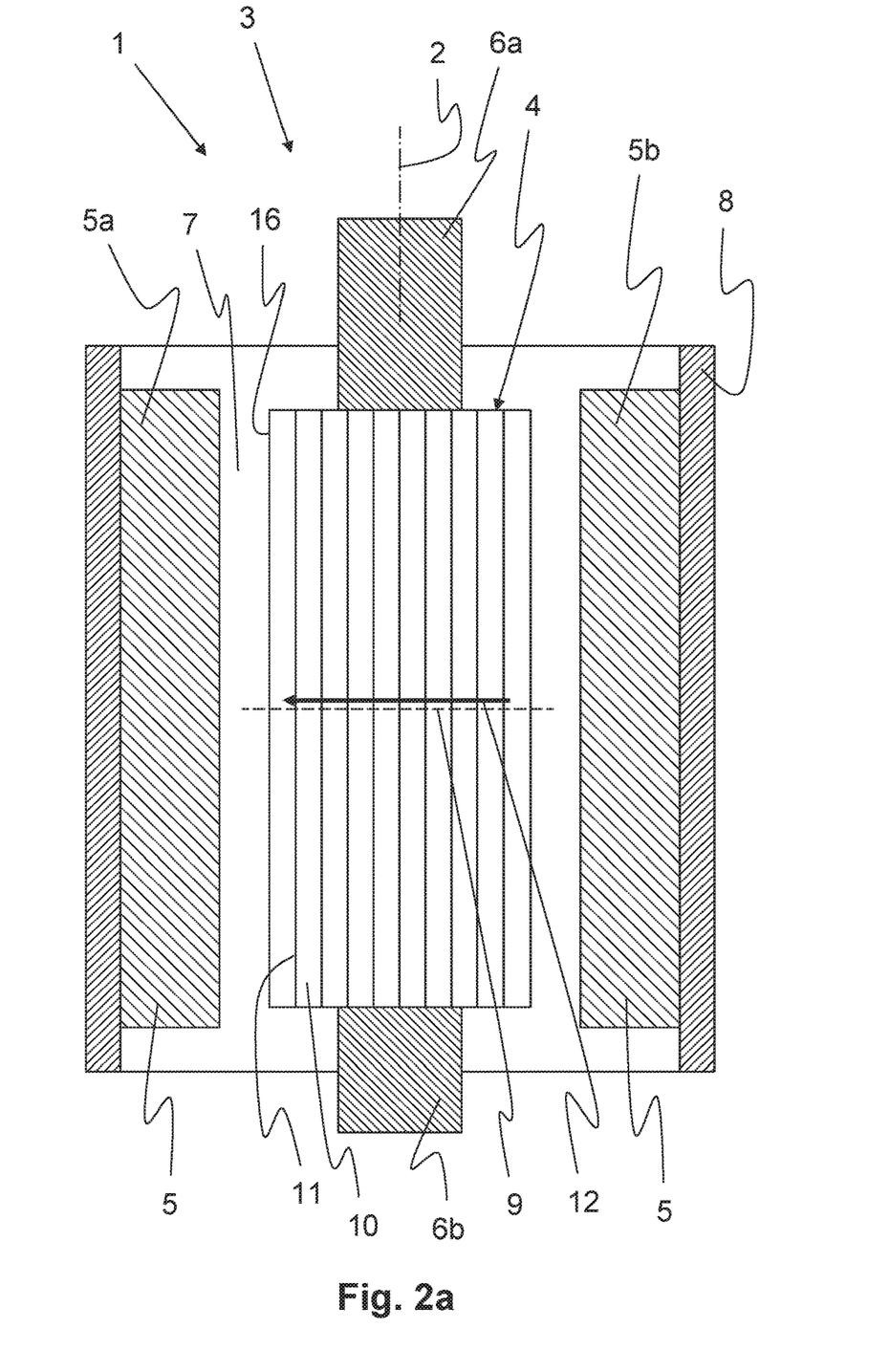
FIG. 2a shows a longitudinal section of an exemplary embodiment of the galvanometer drive comprising a permanent magnet which is formed from multiple magnetic layers which extend in parallel to a rotational axis of a rotor.

FIG. 2a shows an exemplary embodiment of the galvanometer drive 1 comprising a permanent magnet 4 which is formed from multiple magnetic layers 10. For the sake of clarity, only one of the magnetic layers 10 and one of the intermediate layers 11 is provided with a reference sign in the figures. The permanent magnet 4 can be formed, for example, from only two magnetic layers 10 comprising one or more intermediate layers 11. Alternatively, the permanent magnet 4 can also be formed from a plurality of magnetic layers 10, including intermediate layers 11 arranged between the magnetic layers 10, as shown here.

At least one intermediate layer 11 is arranged between two magnetic layers 10 in each case, which connects the two magnetic layers 10 to one another and/or electrically insulates the two magnetic layers 10 from one another. The insulating intermediate layer 11 prevents an electric current from flowing between two adjacent magnetic layers 10. An electric current which may occur is therefore limited to one magnetic layer 10. The eddy current is therefore interrupted by the intermediate layer 11.

Moreover, the magnetic layers 10 and the intermediate layers 11 are arranged one above the other and/or in an alternating manner in the direction of a layer axis 9. The magnetic layers 10 and the intermediate layers 11 therefore form the permanent magnet 4 and the appropriate section of the rotor 3 in a sandwich-like manner. Moreover, the layer axis 9 extends perpendicularly to the magnetic layers 10 and/or the intermediate layers 11.

In the exemplary embodiment represented here, the layer axis 9—along which the magnetic layers 10 and intermediate layers 11 are stacked one above the other—is aligned perpendicularly to the rotational axis 2 of the rotor 3. The magnetic layers 10 and the intermediate layers 11 are therefore aligned essentially in parallel to the rotational axis 2. Eddy currents which flow in a plane perpendicular to the rotational axis 2 are prevented with the aid of such an arrangement.

As is clear from FIG. 2a, the permanent magnet 4 has a direction of magnetization 12 which is represented as a vector. The direction of magnetization 12 is perpendicular to the rotational axis 2 in this case, and so a maximum torque is imparted onto the rotor 3.

In addition, the direction of magnetization 12 is arranged in parallel to the layer axis 9.

Preferably, the support projection 6a is connected to the deflection element (not shown here), for example, a mirror, with the aid of which a laser beam can be deflected for the purpose of laser machining. The precision of the laser beam deflection therefore directly depends on the precision of the rotation of the rotor 3. Therefore, it is advantageous when the eddy current in the permanent magnet 4 is suppressed to the greatest extent possible, in order to prevent a heating of the permanent magnet, and so the deflection unit can be positioned as quickly and precisely as possible.

It is advantageous when a sensor or a measuring element (not represented here) is arranged in the area of the other support projection 6b, with the aid of which the orientation of the rotor 3 can be ascertained. For example, the sensor or the measuring element can be an analog or digital position detector.

Figure 2B:
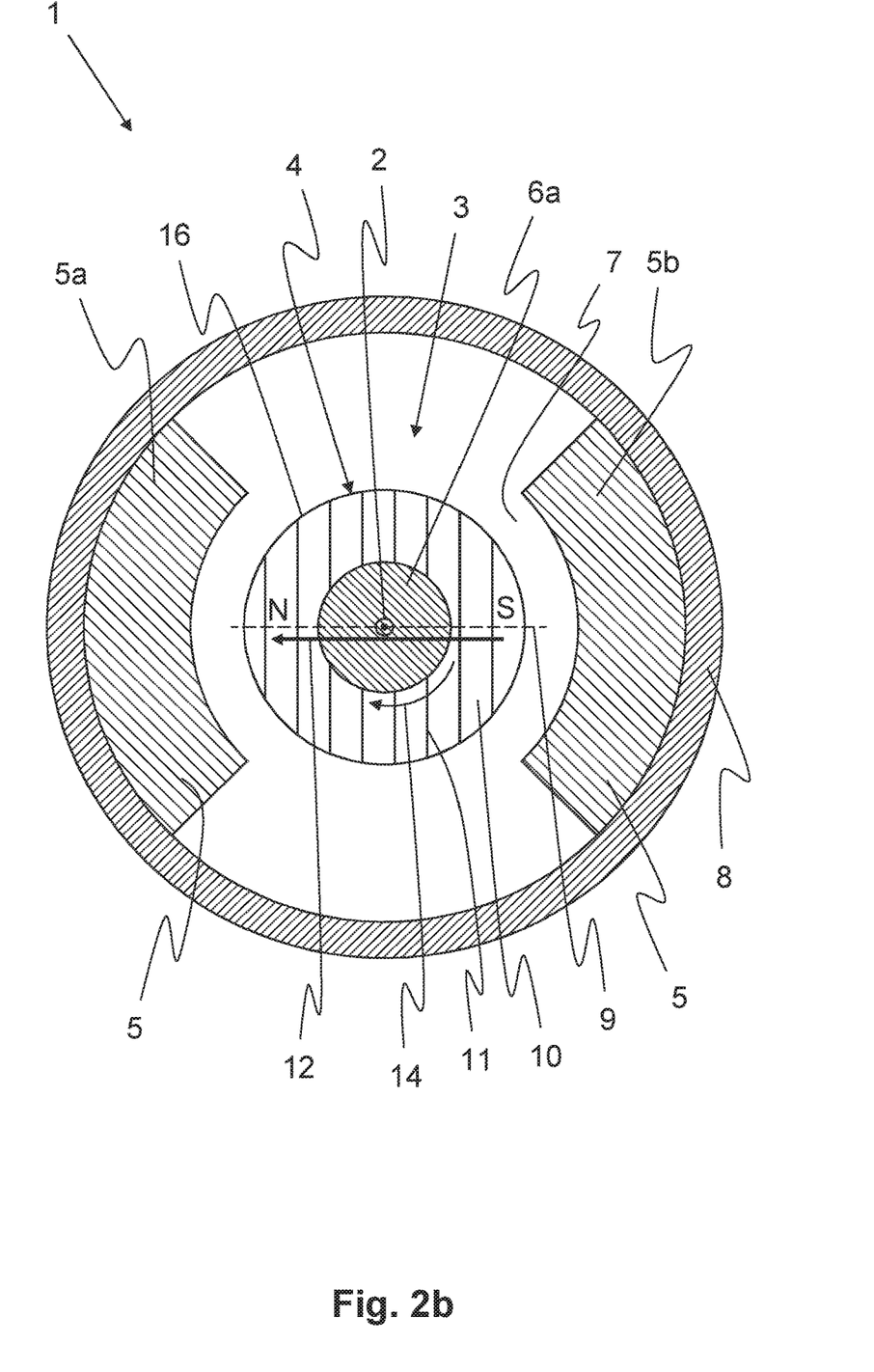
FIG. 2b shows a cross-sectional view of the preceding galvanometer drive in a top view, the permanent magnet of which is formed from multiple magnetic layers.

FIG. 2b shows a cross-sectional view of the galvanometer drive 1, by way of example, for the exemplary embodiment represented in FIG. 2a. As mentioned above, the permanent magnet 4 is formed from multiple magnetic layers 10 including intermediate layers 11 lying between the magnetic layers 10. The layer axis 9 is arranged perpendicularly to the rotational axis 2. In addition, the layer axis 9 is arranged in parallel to the magnetic field of the permanent magnet 4. The magnetic field outside the permanent magnet 4 extends from the north pole N to the south pole S, while the magnetic field within the permanent magnet 4 extends from the south pole S to the north pole N (according to the direction of magnetization 12). Due to this type of arrangement of the magnetic layers 10, the eddy current 15 (as shown, for example, uninhibited in FIGS. 1a/1b) is reduced, and so the heat development in the permanent magnet 4 is reduced. If the layer axis 9 is arranged perpendicularly to the rotational axis 2 but not in parallel to the magnetic field, the eddy current suppression decreases as the angle between the layer axis and the magnetic field increases. Therefore, advantageously, the layer axis 9 should be aligned with an angular deviation of less than ±30°, in particular less than ±15° with respect to the direction of magnetization 12.

In the following description of the additional exemplary embodiments, the same reference signs are utilized for features which are identical or at least comparable to the particular preceding exemplary embodiments in terms of their design and/or mode of operation. Provided said features are not explained in detail once again, their design and/or mode of operation correspond/corresponds to the design and mode of operation of the features already described above. Therefore, the essential differences from the particular preceding exemplary embodiments will be described with priority in the following.

Figure 3:
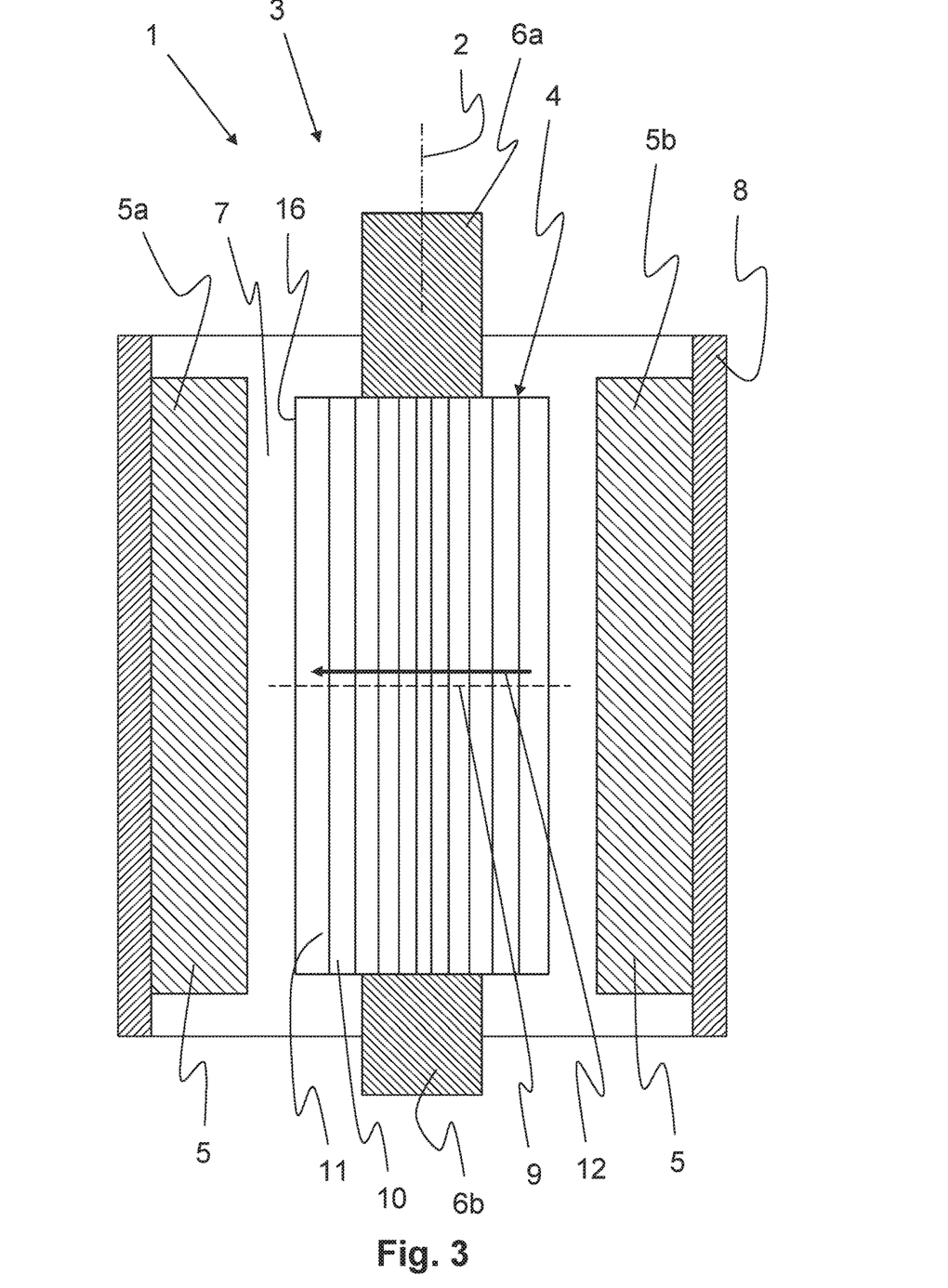
FIG. 3 shows a longitudinal section of a second exemplary embodiment of the galvanometer drive comprising a permanent magnet which has magnetic layers of different thicknesses.

FIG. 3 shows a further exemplary embodiment of the galvanometer drive 1 comprising a permanent magnet 4 which includes magnetic layers 10 having different thicknesses. The magnetic layers 10 and the intermediate layers 11 are arranged in parallel to the rotational axis 2 in this exemplary embodiment. The layer axis 9 extends perpendicularly to the rotational axis 2. The magnetic layers 10 are designed to be thicker in the edge areas of the permanent magnet 4 than in an inner area. As a result, the eddy current 4 is inhibited to a greater extent in the inner area of the permanent magnet than in the edge areas. Moreover, the permanent magnet 4 is more stable as a result, since the thicker edge areas cannot chip off as easily. Magnetic layers having different thicknesses of this type can also be utilized, of course, when the layer axis 9 is arranged transversely or parallel to the rotational axis 2, as shown in the following FIG. 4 or FIG. 5, respectively.

Figure 4:
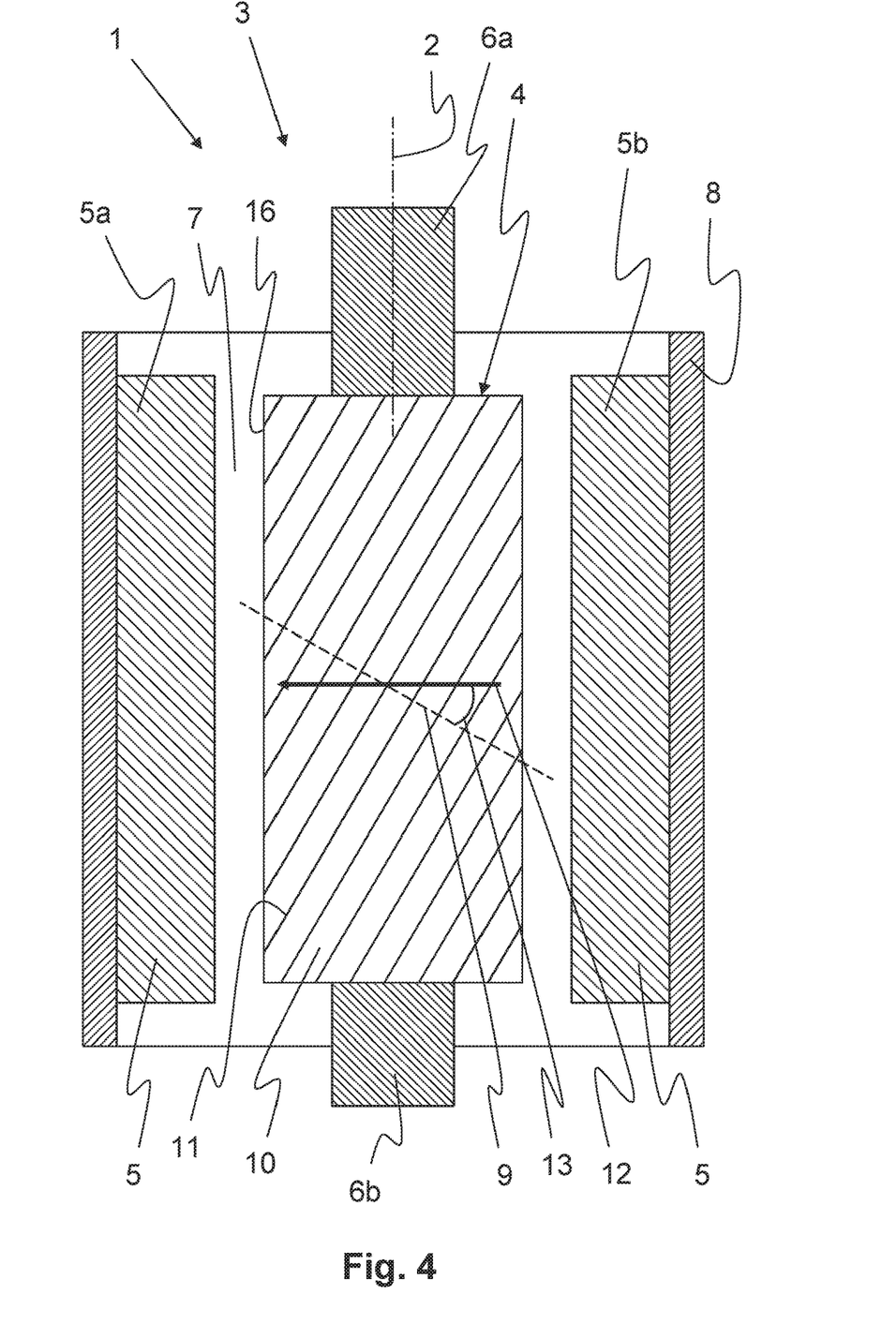
FIG. 4 shows a longitudinal section of a third exemplary embodiment of the galvanometer drive comprising a permanent magnet which is formed from multiple magnetic layers which extend transversely to a rotational axis of a rotor.

FIG. 4 shows a further exemplary embodiment of the galvanometer drive 1 comprising a permanent magnet 4 formed from multiple magnetic layers 10. The direction of magnetization 12 of the permanent magnet 4 is once again aligned perpendicularly to the rotational axis 2. In this exemplary embodiment, however, the layer axis 9 has an angle 13 with respect to the direction of magnetization 12 or the axis. Consequently, the magnetic layers 10 extend transversely to the direction of magnetization 12 and transversely to the rotational axis 2. The angle 13 can be between −30° and +30°. The angle 13 can also be only between −15° and +15°. As described above, the magnetic layers 10 can also have a different thickness (as in FIG. 3, for example) in this case as well.

Figure 5:
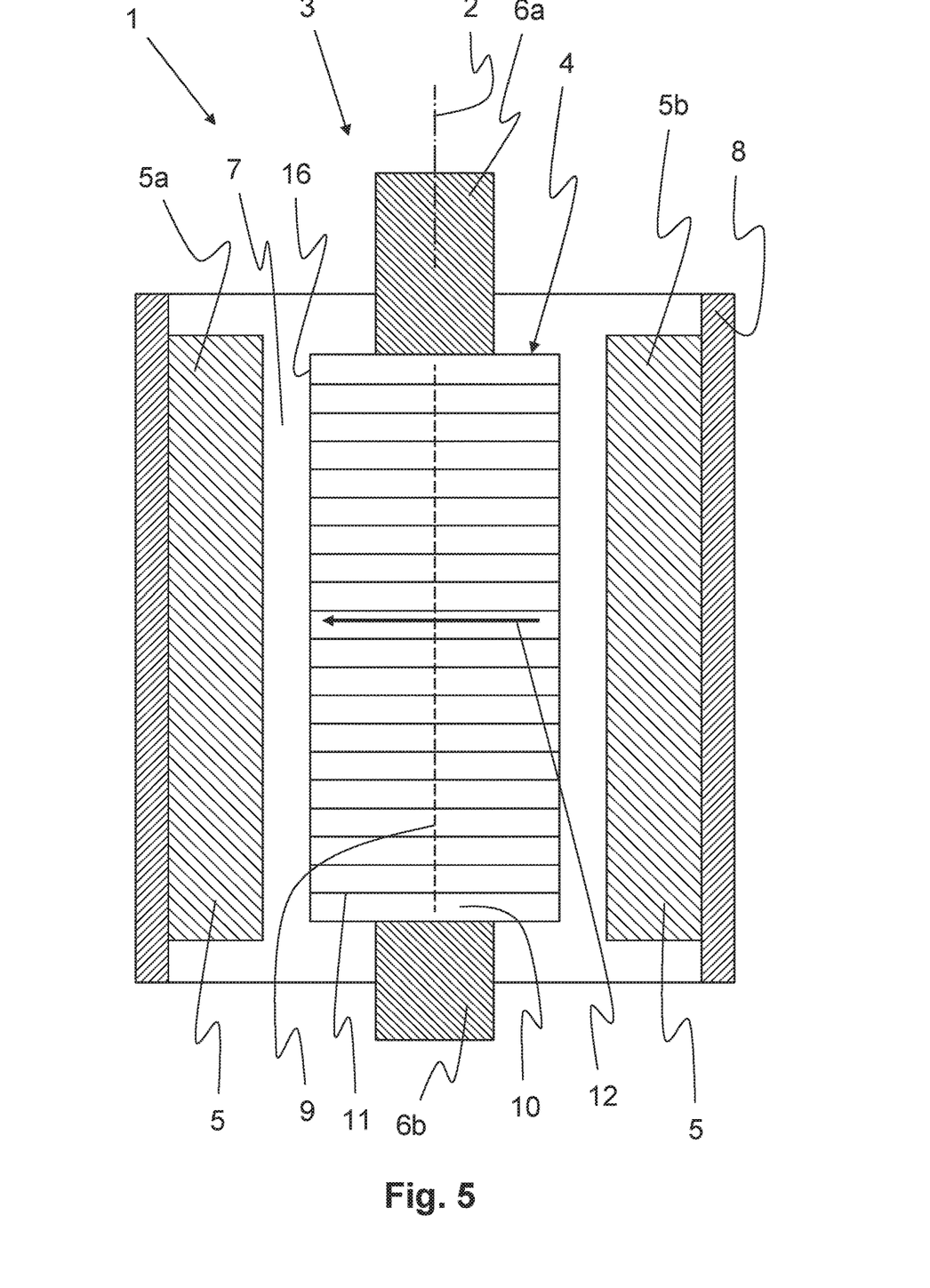
FIG. 5 shows a longitudinal section of a fourth exemplary embodiment of the galvanometer drive comprising a permanent magnet which is formed from multiple magnetic layers which extend perpendicularly to the rotational axis of a rotor.

According to the exemplary embodiment represented in FIG. 5, the layer axis 9 is arranged in parallel to or coaxial with the rotational axis 2. The intermediate layers 11 are therefore oriented in such a way that an eddy current extending in the direction of the rotational axis 2 of the rotor 3 is interrupted or greatly reduced. In this case as well, the magnetic layers 10 can have a different thickness (as in FIG. 3, for example).

Figure 6A:
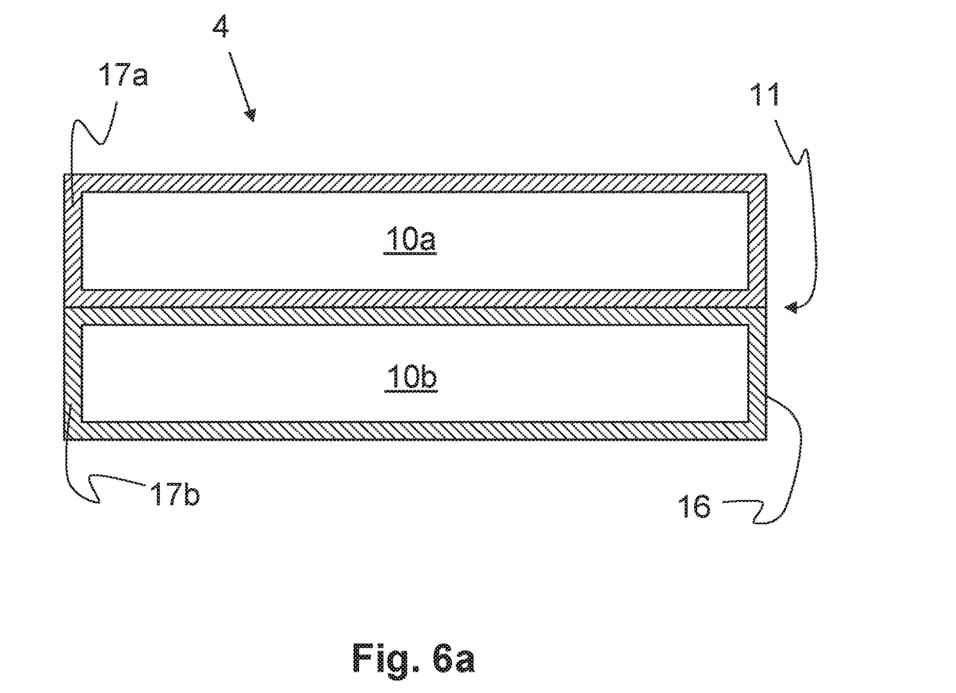
FIG. 6a shows a cut-out of the permanent magnet which encompasses two magnetic layers and a coating.

FIG. 6a shows a detail section of the permanent magnet 4 which, in this case, comprises at least two magnetic layers 10a and 10b which are provided with a coating 17a, 17b, respectively. The coatings 17a, 17b form the intermediate layer 11. The permanent magnet 4 can be formed from more than only two magnetic layers 10, of course. The magnetic layer 10a is completely enclosed by the coating 17a. The magnetic layer 10b is likewise completely enclosed by the coating 17b. Moreover, the coatings 17a, 17b extend over the outer surface 16 of the permanent magnet 4. As a result, the magnetic layers 10a, 10b and, therefore, the permanent magnet 4, are protected against corrosion.

The two coatings 17a, 17b form the intermediate layer 11 in a contact area of the two coatings 17a and 17b. The intermediate layer 11 electrically insulates the two magnetic layers 10a, 10b from one another. The coatings 17a, 17b can be produced, for example, with the aid of a varnish which is preferably applied in the liquid state. The coatings 17a, 17b can also be applied in the form of powder, however. Alternatively, the coatings 17a, 17b can also be deposited onto the magnetic layers 10a, 10b from a gaseous phase. With the aid of a vapor deposition process, for example, particularly thin coatings 17a, 17b can be formed.

Figure 6B:
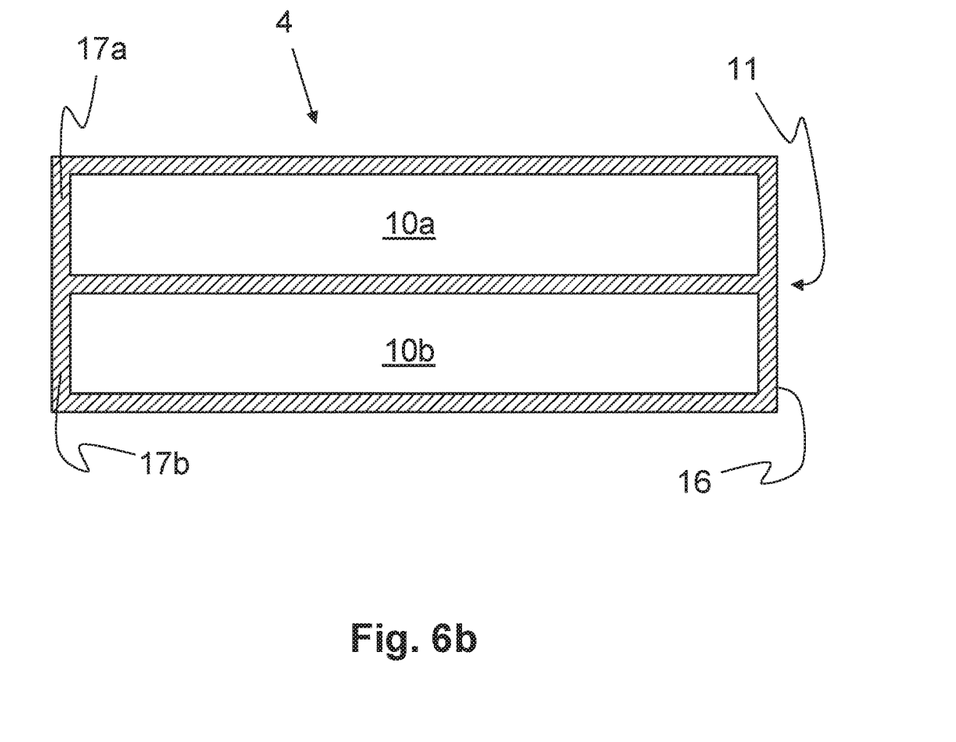
FIG. 6b shows a cut-out of the permanent magnet which encompasses two magnetic layers and a coating, according to an alternative exemplary embodiment.

FIG. 6b shows a detail section of an alternative exemplary embodiment of the permanent magnet 4. The two magnetic layers 10a, 10b are once again enclosed by a coating 17a, 17b, respectively. In this exemplary embodiment, the coatings 17a, 17b transition into one another in the area of the intermediate layer 11, and so the intermediate layer 11 is designed to be thinner than in the exemplary embodiment represented in FIG. 6a. In both exemplary embodiments, the intermediate layer 11 connects the two magnetic layers 10a, 10b to one another in an integrally joined manner.

The present invention is not limited to the represented and described exemplary embodiments. Modifications within the scope of the claims are also possible, as is any combination of the features, even if they are represented and described in different exemplary embodiments.

LIST OF REFERENCE SIGNS

1 galvanometer drive
2 rotational axis
3 rotor
4 permanent magnet
5 stator
5a, 5b stator components
6 support projections
7 gap
8 housing
9 layer axis
10 magnetic layer
11 intermediate layer
12 direction of magnetization
13 angle
14 direction of rotation
15 eddy current
15a, 15b eddy current components
16 outer surface of the permanent magnet
17 coating
S south pole of the permanent magnet
N north pole of the permanent magnet
S' south pole of the stator
N' north pole of the stator

The invention claimed is:

1. A galvanometer drive, comprising:
   a rotor that is rotatable about a rotational axis, the rotor formed in at least one section by a permanent magnet having opposite end faces;
   a support projection connected to and extending from each of the opposite end faces of the permanent magnet, wherein the permanent magnet is rotationally mountable via the support projections;
   a stator surrounding the permanent magnet, the stator including a coil;
   wherein the permanent magnet comprises at least two magnetic layers and at least one electrically insulating intermediate layer arranged between the two magnetic layers;
   wherein the permanent magnet comprises a plurality of the magnetic layers and a plurality of the intermediate layers arranged in an alternating manner one above the other; and
   wherein the magnetic layers and the intermediate layers extend completely through the rotor in a transverse direction of the rotor.

2. The galvanometer drive according to claim 1, wherein the intermediate layer is integrally joined to and connects the two magnetic layers.

3. The galvanometer drive according to claim 1, wherein the magnetic layers comprise a thickness of less than or equal to 2 mm and have the same or a different thickness.

4. The galvanometer drive according to claim 1, wherein the intermediate layer comprises a thickness that is at most 10% of a thickness of at least one of the magnetic layers adjacent the intermediate layer.

5. The galvanometer drive according to claim 1, wherein the magnetic layers and the intermediate layers are stacked one above the other along a layer axis, the layer axis extending parallel to the rotational axis such that the magnetic layers and the intermediate layers are aligned perpendicularly to the rotational axis.

6. The galvanometer drive according to claim 1, wherein the magnetic layers and the intermediate layers are stacked one above the other along a layer axis, the layer axis extending perpendicular to the rotational axis such that the magnetic layers and the intermediate layers are aligned parallel to the rotational axis.

7. The galvanometer drive according to claim 1, wherein the permanent magnet comprises a direction of magnetization that is perpendicular to the rotational axis, the magnetic layers and the intermediate layers stacked one above the other along a layer axis that is aligned with an angular deviation of less than ±30 with respect to the direction of magnetization.

8. The galvanometer drive according to claim 1, wherein the intermediate layer comprises a coating formed on an outer surface of one or both of the adjacent magnetic layers.

9. The galvanometer drive according to claim 1, wherein the permanent magnet comprises a plurality of the magnetic layers and a plurality of the intermediate layers stacked one above the other along a layer axis, wherein the magnetic layers towards an inner area of the permanent magnet are thinner than the magnetic layers towards an outer edge area of the permanent magnet.

10. The galvanometer drive according to claim 1, wherein the permanent magnet comprises a rotationally symmetrical solid body with an outer diameter between 2 mm and 20 mm.

11. A method for manufacturing a rotatable rotor of a galvanometer drive, wherein the rotor comprises at least one section formed from a permanent magnet having opposite end faces, the permanent magnet comprising a plurality of stacked magnetic layers separated by an insulating intermediate layer between adjacent ones of the magnetic layers wherein the magnetic layers and the intermediate layers extend completely through the rotor in a transverse direction of the rotor, the method comprising:
joining the magnetic layers and the intermediate layers together into a blank;
working an outer contour of the blank into the rotor; and
connecting a support projection to each of the opposite end faces, the support projections coaxial with a rotational axis of the rotor.

12. A deflection unit for deflecting a laser beam, comprising:
an optical deflection element;
a galvanometer drive, the optical deflection element connected to the galvanometer drive, wherein the optical deflection element is bidirectionally rotatable via the galvanometer drive; and
wherein the galvanometer drive is accordance with the galvanometer drive of claim 1.

* * * * *